(12) United States Patent
Bacher et al.

(10) Patent No.: US 12,055,614 B2
(45) Date of Patent: Aug. 6, 2024

(54) CHARACTERIZING A MOTION OF AN OBJECT

(71) Applicant: Siemens Healthcare GmbH, Erlangen (DE)

(72) Inventors: Mario Bacher, Erlangen (DE); Peter Speier, Erlangen (DE)

(73) Assignee: Siemens Healthineers AG, Forchheim (DE)

( * ) Notice: Subject to any disclaimer, the term of this patent is extended or adjusted under 35 U.S.C. 154(b) by 233 days.

(21) Appl. No.: 17/684,454

(22) Filed: Mar. 2, 2022

(65) Prior Publication Data

US 2022/0291321 A1 Sep. 15, 2022

(30) Foreign Application Priority Data

Mar. 10, 2021 (EP) .................................... 21161848

(51) Int. Cl.
*G01R 33/565* (2006.01)
(52) U.S. Cl.
CPC .............................. *G01R 33/56509* (2013.01)
(58) Field of Classification Search
CPC ............ G01R 33/5617; G01R 33/4835; G01R 33/5676; G01R 33/5673; G01R 33/567; G01R 33/56509; G06T 11/006
See application file for complete search history.

(56) References Cited

U.S. PATENT DOCUMENTS

| | | | |
|---|---|---|---|
| 9,857,446 B2 | 1/2018 | Zhang et al. | |
| 2017/0160364 A1 | 6/2017 | Fenchel et al. | |
| 2017/0160367 A1 | 6/2017 | Schroter et al. | |
| 2018/0353139 A1 | 12/2018 | Speier et al. | |
| 2018/0353140 A1 | 12/2018 | Speier et al. | |
| 2019/0250236 A1* | 8/2019 | Paul | G01R 33/5611 |
| 2019/0377051 A1 | 12/2019 | Bacher et al. | |
| 2020/0110145 A1 | 4/2020 | Zeller | |
| 2020/0367765 A1 | 11/2020 | Bacher et al. | |
| 2020/0375463 A1* | 12/2020 | Hess | A61B 5/7289 |
| 2021/0239778 A1 | 8/2021 | Bacher et al. | |

FOREIGN PATENT DOCUMENTS

| | | |
|---|---|---|
| DE | 102015224158 A1 | 6/2017 |
| DE | 102020201102 A1 | 8/2021 |

OTHER PUBLICATIONS

Weller, Daniels et al.: "Real-time filtering with sparse variations for head motion in magnetic resonance imaging". Signal Processing; vol. 157; Dec. 3, 2018; pp. 170-179.

* cited by examiner

*Primary Examiner* — Rishi R Patel
(74) *Attorney, Agent, or Firm* — Lempia Summerfield Katz LLC

(57) ABSTRACT

According to a method for characterizing a motion of an object, a reference signal is emitted into a target region and two or more receiver coil signals are generated in response to the reference signal by two or more receiver coils. A motion signal characterizing a motion of the object is determined by a computing unit depending on temporal modulations of the two or more receiver coil signals. A correlation coefficient of the motion signal and a receiver coil signal is computed by the computing unit. A reference correlation coefficient is determined by the computing unit depending on a location of the receiver coil based on a predetermined reference correlation map. The motion signal is corrected by the computing unit depending on a correlation coefficient and the reference correlation coefficient.

15 Claims, 3 Drawing Sheets

1 MRI system
2 Patient table
3 Patient
4a Receiver coil
4b Receiver coil
4c Receiver coil
5 Reference signal generator
6 Target region
7 Computing unit
8 Magnet unit
9 Field magnet
10 Gradient coils 1 MRI system
2 Patient table
3 Patient
4a Receiver coil
4b Receiver coil
4c Receiver coil
5 Reference signal generator
6 Target region
7 Computing unit
8 Magnet unit
9 Field magnet
10 Gradient coils 11 Reference correlation map
12 Peripheral region
13 Region surrounding location
14 Location of reference signal generator

CHARACTERIZING A MOTION OF AN OBJECT

The present patent document claims the benefit of European Patent Application No. 21161848.3, filed Mar. 10, 2021, which is hereby incorporated by reference in its entirety.

TECHNICAL FIELD

The present disclosure is directed to a method for characterizing a motion of an object. The disclosure is further directed to a corresponding system for characterizing a motion of an object, to a method for imaging an object, to an imaging system, and to computer program products.

BACKGROUND

Magnetic resonance devices are imaging devices which, in order to image an object under examination, align nuclear spins of the object under examination with a strong external magnetic field and excite them to process around this alignment by an alternating magnetic field. The precession, or more precisely the return of the spins from this excited state to a lower energy state, generates an alternating magnetic field in response, which is received via antennas as magnetic resonance signals.

Magnetic gradient fields are used to impose a spatial encoding on the signals, which subsequently allows the received signal to be assigned to a volume element. The received signal is then analyzed and a three-dimensional reconstruction of the object under examination may be provided.

Therein, image acquisition requires several milliseconds to seconds depending on the pulse sequence used and a longer acquisition time may result in less noise artifacts. It is therefore reasonable to start image acquisition at the beginning of each phase in which the body remains relatively motionless, in order to avoid motion artifacts caused by movement during image acquisition. Motion that cannot be avoided origin, for example, from respiration and heartbeat. However, a phase with movements may be followed by a phase of relative rest, for example, after exhalation or a contraction of the heart muscle.

It is known to record the movements by mechanical sensors or by electrodes, which measure the excitation potentials of the muscles, or by camera monitoring.

According to pilot tone navigation, it exploited that the object to be imaged affects an electromagnetic field due to its electric conductivity and electric permittivity. Because motion of the object alters the spatial distribution of conductivity and permittivity, a response to an electromagnetic reference signal, also denoted as pilot tone, measured by receiver coils shows temporal modulations due to the motion. The measured signals of different receiver coils or receiver channels may carry a mixture of different motions, (e.g., respiratory and cardiac motion), wherein the mixture depends on the receiver coil location.

The measured signals may be combined in such a way that the different motions or motion types are separated, for example, by a blind source separation algorithm. However, the resulting motion signals are of indeterminate sign. For example, it is not known whether a positive slope, (e.g., in a cardiac signal), corresponds to a contraction or expansion of the heart.

The signs of the motion, in particular the cardiac and respiratory motion components, are of importance for scheduling data acquisition or for motion compensated image reconstruction. The correct sign may be determined by including additional information sources, such as electrocardiograms or respiration belts. Furthermore, the motion signals may be compared to reference patterns based on empirical knowledge. However, in irregular or pathologic cases, the reference patterns may not be applicable.

The publication DE 10 2015 224 158 A1 describes a transmitter for pilot tone navigation in a magnetic resonance device as well as a method for detecting a movement of a patient. The transmitter has a power supply and an antenna and is configured to transmit a pilot tone signal via the antenna. The transmitter further includes a decoupling element to protect the transmitter output from signals received by the antenna during excitation pulses of the device during a scan.

SUMMARY AND DESCRIPTION

It therefore an object of the present disclosure to provide an improved concept for characterizing a motion of an object, in particular by pilot tone navigation, which allows for a reliable determination of the sign of the corresponding motion signals without requiring additional information sources.

The scope of the present disclosure is defined solely by the appended claims and is not affected to any degree by the statements within this summary. The present embodiments may obviate one or more of the drawbacks or limitations in the related art.

The improved concept is based on the idea to correlate the motion signal to an individual receiver coil signal and to take into account the result of the correlation as well as a reference correlation coefficient, which depends on the respective receiver coil location, in order to correct the motion signal.

According to the improved concept, a method for characterizing a motion of an object is provided. The object is at least partially located in a target region. An electromagnetic reference signal, which may also be denoted as pilot tone, is emitted by a reference signal generator, which may also be denoted as pilot tone generator, into the target region. Two or more receiver coil signals are generated in response to the emitted reference signal by two or more respective receiver coils located in the target region. A first motion signal characterizing a first motion of the object is determined by a computing unit depending on temporal modulations of the two or more receiver coil signals. A first correlation coefficient of the first motion signal and a first receiver coil signal of the two or more receiver coil signals, which is generated by a first receiver coil of the two or more receiver coils in response to the emitted reference signal, is computed by the computing unit. A first reference correlation coefficient is determined by the computing unit depending on a location of the first receiver coil based on a predetermined first reference correlation map. The first motion signal is corrected by the computing unit depending on the first correlation coefficient and depending on the first reference correlation coefficient.

The object may correspond to a human or animal body. Characterizing the motion of the object may be understood such that quantitative information about the motion as a function of time is determined, in particular in the form of the corrected first motion signal. In other words, the corrected first motion signal may be considered as a result of the method. For example, an amplitude of the corrected first motion signal may be proportional to an amplitude of a corresponding first motion of the object. The first motion may correspond to motion of a first part, in particular body part, of the object or as a first type of motion or as a motion component of a first origin. Apart from the first motion signal, in several implementations, one or more second motion signals characterizing corresponding one or more second motions of the object may be determined depending on the temporal modulations of the two or more receiver coil signals. For example, the first motion signal may correspond to a respiratory motion and the second motion signal may correspond to a cardiac motion or vice versa.

Because the presence of the object and the motion of the object does alter an electromagnetic field in the target region, the receiver coil signals generated in response to the electromagnetic reference signal show the described temporal modulations upon motion of the object. Because the motion may be complex and may include contributions from both cardiac motion and respiratory motion, different contributions to the motion may be separated from each other resulting in the first and, for example, one or more second motion signals. This may be achieved by using a blind source separation algorithm, such as an independent component analysis algorithm or a dependent component analysis algorithm or a principal component analysis algorithm or a stationary subspace analysis algorithm.

For determining the first motion signal, the computing unit takes into account the respective temporal modulations of all of the two or more receiver coil signals. Each receiver coil signal of the two or more receiver coil signals may include contributions from all motion types, however, with different amplitudes and/or signs depending on the location of the respective receiver coil.

The location of a receiver coil of the two or more receiver coils, in particular the location of the first receiver coil, may be understood as a location in a reference coordinate system, wherein the location of the reference signal generator is fixed in the reference coordinate system. In other words, the location of the receiver coils corresponds to a location relative to the location of the reference signal generator.

The first correlation coefficient may be given by a temporal correlation coefficient, for example, a Spearman or Pearson correlation coefficient of the first motion signal and the respective first receiver coil signal. Analogously, the first reference correlation coefficient corresponds to a predetermined, simulated or modelled Spearman or Pearson correlation coefficient. For obtaining the first reference correlation coefficient and, in particular, the first reference correlation map, a simulated version of the first motion signal may be correlated to an assumed underlying motion of the object assumed for the simulation.

Consequently, in case the first correlation coefficient and the first reference correlation coefficient have the same sign, it may be deduced that the sign of the first motion signal is correct. In case of opposite signs of the first correlation coefficient and the first reference correlation coefficient, the first motion signal has the wrong sign, which may be corrected by generating the corrected first motion signal.

Therefore, according to the improved concept, the correct sign of the first motion signal may be obtained without using potentially unreliable additional information about how the first motion signal presumably may look like and without the use of additional information sources as, for example, electrocardiography measurements, respiration belts, or camera monitoring.

According to several implementations of the method, for correcting the first motion signal, a sign of the first motion signal is inverted depending on the first correlation coefficient and depending on the first reference correlation coefficient.

According to several implementations, the first correlation coefficient is compared to the first reference correlation coefficient by the computing unit and the first motion signal is corrected depending on a result of the comparison.

In particular, if the result of the comparison indicates that the signs of the first correlation coefficient and the first reference correlation coefficient are the same, the sign of the first motion signal is not inverted and in case the result of the comparison indicates that the first correlation coefficient and the first reference correlation coefficient have opposite signs, the sign of the first motion signal is inverted.

Such implementations have the advantage that only very simple and fast computational steps are necessary for correcting the first motion signal depending on the first correlation coefficient and the first reference correlation coefficient.

According to several implementations, the two or more receiver coils include at least one second receiver coil. For each of the at least one second receiver coil, a respective second correlation coefficient of the first motion signal and a respective second receiver coil signal of the two or more receiver coil signals, which is generated by the respective second receiver coil, is computed by the computing unit. For each of the at least one second receiver coil, a respective second reference correlation coefficient is determined by the computing unit depending on a location of the respective second receiver coil based on the first reference correlation map. The first motion signal is corrected by the computing unit depending on the at least one second correlation coefficient and the at least one second reference correlation coefficient, in particular in addition to the first correlation coefficient and the first reference correlation coefficient.

By taking into account not only one receiver coil signal but two or more of them, possible inaccuracies of the underlying model for generating the first reference correlation map may have a reduced impact on the accuracy of the result of the method.

In particular, in such implementations, the first correlation coefficient, the first reference correlation coefficient, at least one second correlation coefficient, and a respective second reference correlation coefficient for each of the at least one second correlation coefficient are determined.

According to several implementations, a weighted sum of the first correlation coefficient and the at least one second correlation coefficient is computed by the computing unit. A weighted reference sum of the first reference correlation coefficient and the at least one second reference correlation coefficient is computed by the computing unit and the first motion signal is corrected by the computing unit depending on the weighted sum and the weighted reference sum.

In particular, for computing the weighted sum and the weighted reference sum, identical weights for the correlation coefficients corresponding to each other are used. In other words, the weight used for the first correlation coefficient in the weighted sum is the same as the weight used for the first reference correlation coefficient in the weighted reference sum and so forth.

In particular, the weighted reference sum may be compared to the weighted sum and the first motion signal is corrected, in particular the sign of the first motion signal is inverted, depending on a result of the comparison of the weighted sum and the weighted reference sum. For example, a deviation between the weighted sum and the weighted reference sum, in particular a difference between them, is computed. In case the difference is greater than a predetermined threshold value, the first motion signal may be inverted in its sign, and the sign may be unchanged otherwise. Alternatively, the sign of the first motion signal may be inverted in case the weighted sum and the weighted reference sum have opposite signs and the sign of the first motion signal may not be inverted in case the weighted sum and the weighted reference sum have the same sign.

According to several implementations, a time-dependent object model of the object concerning an electrical conductivity and an electric permittivity is provided. A model for the reference signal generator is provided, and an electromagnetic simulation is carried out by the computing unit or by a further computing unit depending on the object model and the model for the reference signal generator. A first simulated motion signal characterizing a first motion of the object model, wherein the first motion of the object model corresponds, in particular, to the first motion of the object, is determined by the computing unit or the further computing unit depending on temporal modulations of a result of the electromagnetic simulation. The first reference correlation map is generated by the computing unit or the further computing unit depending on the first simulated motion signal.

The time-dependent object model may include a description of the spatial distribution of the electrical conductivity and the electric permittivity, which changes in a predefined way as a function of time in order to model the motion of the object. For example, the object may be segmented into three-dimensional segments having constant electrical conductivity and electric permittivity. The arrangement of the segments may be non-rigidly deformed in order to simulate the motion, in particular, distinct time points in a respiratory or cardiac cycle or both. For example, in case of a human or animal body to be modelled, the body may be approximated by different types of tissue and a three-dimensional discretization or voxelization of the regions of the same tissue may be carried out. Depending on the implementation of the electromagnetic simulation, different geometrical shapes of the discrete volume elements of the model may be used, for example, cubic voxels or pyramids.

The model for the reference signal generator includes, in particular, a location of the reference signal generator, an orientation of the reference signal generator, and parameters concerning its geometry, winding number, and so forth.

The result of the electromagnetic simulation may then include three-dimensional electric and magnetic fields as a function of time or, in other words, four-dimensional electric and magnetic fields, of the target region. The electromagnetic simulation may be based on a method of finite elements or a method of finite differences in the time domain or a method of finite differences in the frequency domain.

In order to generate the first reference correlation map, the result of the electromagnetic simulation, in particular the fluctuating electromagnet field due to the temporal modulations, may be correlated to the known motion of the model of deformation of the model due to a simulated respiratory motion and/or cardiac motion. The resulting correlation coefficients yield the first reference correlation map.

According to several implementations, a second motion signal characterizing a second motion of the object is determined by the computing unit depending on the temporal modulations of the two or more receiver coil signals. A second correlation coefficient of the second motion signal and the first receiver coil signal is computed by the computing unit. A second reference correlation coefficient is determined by the computing unit depending on the location of the first receiver coil based on a predetermined second reference correlation map. The second motion signal is corrected by the computing unit depending on the second correlation coefficient and the second reference correlation coefficient.

All implementations and explanations in regard to the first motion signal may be carried over analogously to the second motion signal.

In particular, the first motion signal may correspond to a respiratory motion of the object and the second motion signal may correspond to a cardiac motion of the object or vice versa.

For example, for generating the first reference correlation map, the object model may be chosen to simulate the first motion and for generating the second reference correlation map, the object model may be chosen to simulate the second motion.

According to several implementations, the first motion signal and/or the second motion signal is determined by applying a blind source separation algorithm to the two or more receiver coil signals.

According to the improved concept, also a method for imaging an object, in particular a magnetic resonance imaging method, is provided. The object is positioned at least partially in a target region, and a method for characterizing a motion of the object according to the improved concept is carried out. An image of the object is reconstructed by the computing unit depending on data acquired during a data acquisition period.

In case of a magnetic resonance imaging method, a pulse sequence of excitation pulses may be applied to the object, and the two or more receiver coils may be used to receive corresponding MR-signals, and the computing unit may determine the acquired data based on the MR-signals.

According to several implementations, motion compensated data is generated by the computing unit depending on the acquired data and the corrected first motion signal and the image is generated depending on the motion compensated data.

According to several implementations, the data acquisition period is triggered or scheduled by the computing unit depending on the corrected first motion signal.

In this way, it may be achieved that the data acquisition period starts at a given instance in the cardiac or respiratory cycle, or it may be achieved that the data acquisition period matches a particularly suitable part of the cardiac or respiratory cycle, for example, with a low amount of motion to be expected.

According to the improved concept, also a system for characterizing a motion of an object is provided. The system includes a target region to locate the object at least partially in the target region and a reference signal generator as well as a control unit. The control unit is configured to control the reference signal generator to emit an electromagnetic reference signal into the target region. The system includes two or more receiver coils, which are located in the target region and configured to generate two or more receiver coil signals in response to the emitted reference signal. The system includes a computing unit, which is configured to determine a first motion signal characterizing a first motion of the object depending on temporal modulations of the two or more receiver coil signals. The computing unit is configured to compute a first correlation coefficient of the first motion signal and the first receiver coil signal of the two or more receiver coil signals, which is generated by a first receiver coil of the two or more receiver coils. The computing unit is configured to determine a first reference correlation coefficient depending on a location of the first receiver coil based on a predetermined first reference correlation map and to correct the first motion signal depending on the first correlation coefficient and the first reference correlation coefficient.

Further implementations of the system for characterizing a motion of an object according to the improved concept follow directly from the various implementations of the method for characterizing a motion of an object according to the improved concept and vice versa. In particular, a system for characterizing a motion of an object according to the improved concept may be configured to carry out a method for characterizing a motion of an object according to the improved concept or it carries out such a method.

According to the improved concept, also an imaging system, (e.g., a magnetic resonance imaging system), including a system for characterizing a motion of an object according to the improved concept is provided. The imaging system further includes a signal source, which is configured to emit a signal into the target region during an acquisition period. The imaging system includes a sensing arrangement configured to generate acquired data in response to the signal emitted by the signal source. The computing unit is configured to generate an image of the object depending on the acquired data.

In case of a magnetic resonance imaging system, the sensing arrangement may correspond to the two or more receiver coils. The signal emitted by the signal source may correspond to radio frequency excitation pulses according to an MRI pulse sequence.

According to several implementations of the imaging system, the computing unit is configured to generate motion compensated data depending on the acquired data and depending on the corrected first motion signal and to generate the image depending on the motion compensated data.

According to several implementations, the computing unit is configured to trigger the data acquisition period or to trigger or schedule the data acquisition period depending on the corrected first motion signal.

An imaging system according to the improved concept may be configured to carry out a method for imaging an object according to the improved concept or carries out such a method.

According to the improved concept, also a first computer program including first instructions is provided. When executed by a system for characterizing a motion of an object according to the improved concept, the first instructions cause the system to carry out a method for characterizing a motion of an object according to the improved concept.

According to the improved concept, a first computer-readable storage medium storing the first computer program is provided.

According to the improved concept, a second computer program is provided, which includes second instructions. When the second instructions are executed by an imaging system according to the improved concept, the second instructions cause the imaging system to carry out a method for imaging an object according to the improved concept.

According to the improved concept, a second computer-readable storage medium is provided, which stores a second computer program according to the improved concept.

The features and feature combinations mentioned above or below in the description of figures and/or shown in the figures alone are usable not only in the respective specified combinations, but also in other combinations without departing from the scope of the disclosure. Implementations and feature combinations, which do not have all features of an originally formulated independent claims and/or extend beyond or deviate from the feature combinations set out in the relations of the claims, are also to be considered as disclosed.

BRIEF DESCRIPTION OF THE DRAWINGS

In the following, the disclosure will be explained in detail with reference to specific exemplary implementations and respective schematic drawings. In the drawings, identical or functionally identical elements may be denoted by the same reference signs. The description of identical or functionally identical elements is not necessarily repeated with respect to different figures.

DETAILED DESCRIPTION

Figure 1:
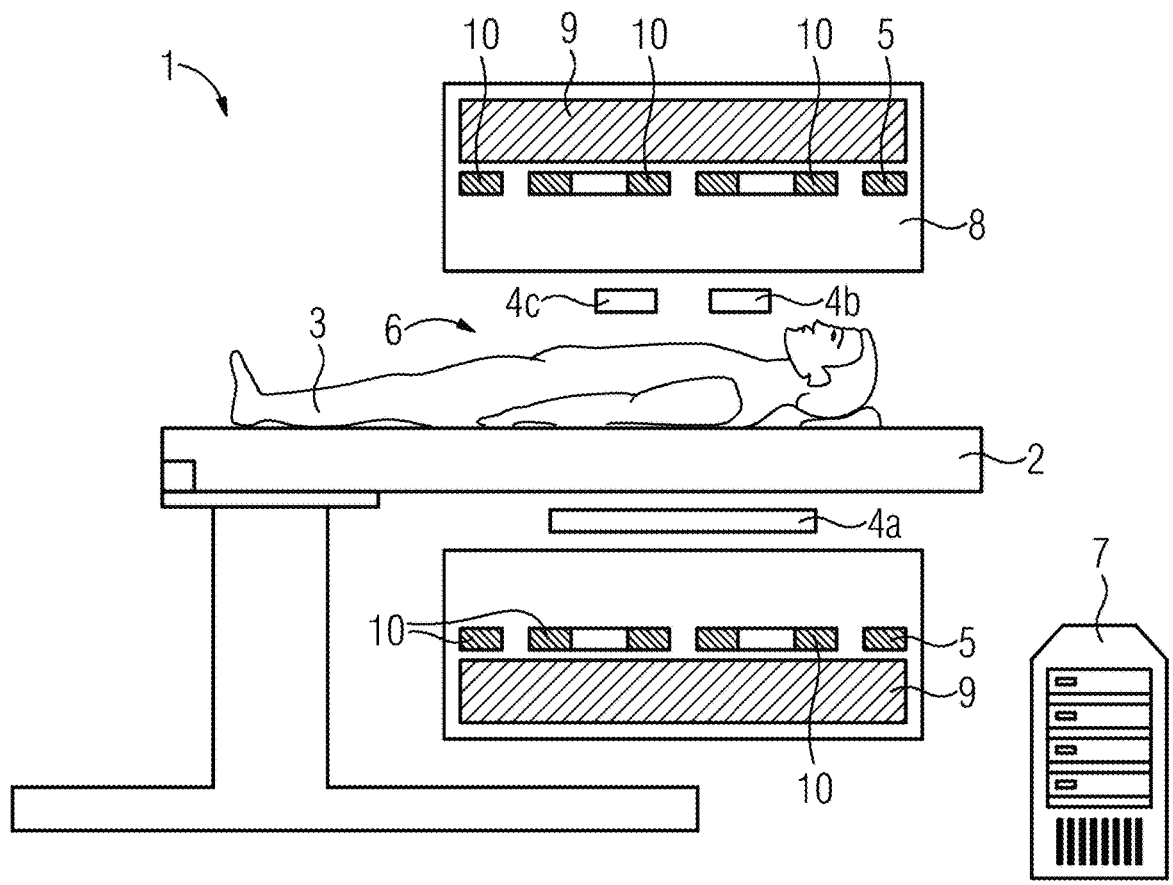
FIG. 1 depicts a schematic representation of an exemplary implementation of a system for characterizing a motion of an object.

FIG. 1 depicts a schematic representation of an exemplary embodiment of an imaging system 1 according to the improved concept designed as a system for magnetic resonance imaging, MRI. The imaging system is denoted as MRI system 1 in the following.

The MRI system 1 has a magnet unit 8 with a field magnet 9 that generates a static magnetic field for aligning nuclear spins of an object, (e.g., a patient 3), in an examination region or target region 6. The patient 3 may be located on a patient table 2, for example. The target region 6 is characterized by an extremely homogeneous static magnetic field, wherein the homogeneity relates in particular to the magnetic field strength or its magnitude. The target region 6 may be located in a patient tunnel which extends in a longitudinal direction through the magnet unit 8. The field magnet 9 may be a superconducting magnet capable of providing magnetic fields with a magnetic flux density of up to 3 T or more. However, for lower field strengths, permanent magnets or electromagnets with normal conducting coils may be used.

Furthermore, the magnet unit 8 includes gradient coils 10 configured to superimpose location-dependent magnetic fields in three spatial directions to the static magnetic field for spatial differentiation of the detected imaging regions in the target region 6. The gradient coils 10 may be designed as coils of normal conducting wires, which may generate mutually orthogonal fields or field gradients in the target region 6.

The magnet unit 8 may include as a transmitting antenna, (e.g., a body coil 4a), configured to emit a radio frequency signal supplied via a signal line into the target region 6. The body coil 4a may also be used, in some embodiments, as a receiver coil 4a to receive resonant signals emitted by the patient 3 and deliver them via a signal line. Furthermore, additional receiver coils 4b, 4c may be located within the target region 6.

The MRI system 1 includes a control unit (not shown) that may provide the magnet unit 8 with various signals for the gradient coils 10 and the body coil 4a, and may evaluate the received signals from the receiver coils 4a, 4b, 4c. For example, the control unit may include a gradient control configured to supply the gradient coils 10 with variable currents via feed lines that may provide the desired gradient fields in the examination area in a time-coordinated manner.

The control unit may also include a radio frequency unit configured to generate radio frequency pulses or excitation pulses with predetermined time courses, amplitudes, and spectral power distribution to excite a magnetic resonance of the nuclear spins in the patient 3. Pulse powers in the range of kilowatts may be used. The excitation pulses may be radiated into the patient 3 via the body coil 4a or via one or more further emitter coils. The control unit may also include a controller that may communicate with the gradient controller and the radio frequency unit via a signal bus.

The receiver coils 4a, 4b, 4c are in a signal connection with a computing unit 7 of the MRI system 1. The computing unit 7 may include a programmable logical unit such as a field programmable gate array (FPGA), a digital signal processor (DSP), or a central processing unit (CPU).

Furthermore, the MRI system 1 includes a reference signal generator 5, also denoted as pilot tone generator, which may be arranged in or outside of the magnet unit 8. In particular, the position of the reference signal generator 5 may be different from the position indicated in FIG. 1. For example, the reference signal generator 5 may be positioned close to the heart of the patient 3, for example, close to the positions of the receiver coils 4b, 4c in FIG. 1. It is, however, also possible to locate the reference signal generator 5 in the patient table 2 or near the gradient coils 10.

The MRI system 1 is configured to carry out a method for imaging an object according to the improved concept and, in particular, a method for characterizing a motion of the object according to the improved concept.

The reference signal generator 5 may be controlled to emit an electromagnetic reference signal, in particular denoted as pilot tone, into the target region 6. The reference signal may be off-band with respect to the radio frequency pulses for exciting the MR resonances, and, correspondingly, off-band with respect to the received MR-signals. In this way, a distinct separation between MR-signals and receiver coil signals of the receiver coils 4a, 4b, 4c generated in response to the electromagnetic reference signal is achievable.

Each of the receiver coils 4a, 4b, 4c placed around the patient 3 in the target region 6 generates a respective receiver coil signal carrying a mixture of cardiac and respiratory motion of the patient 3 of a priori unknown sign. The sign depends on the position and orientation of the receiver coil 4a, 4b, 4c relative to the reference signal generator 5 and the tissue of the patient 3. The computing unit 7 applies a blind source separation (BSS) algorithm to the receiver coil signals generated by the receiver coils 4a, 4b, 4c in response to the electromagnetic reference signal in order to determine a respiratory motion signal and a cardiac motion signal concerning the respiratory motion and the cardiac motion, respectively, of the patient 3.

The computing unit 7 may correlate the cardiac motion signal or the respiratory motion signal to the receiver coil signals. By comparing the resulting correlation coefficients to a predetermined cardiac reference correlation map and/or a predetermined respiratory reference correlation map, respectively, it may be determined, whether the cardiac motion signal and/or the respiratory motion signal may be inverted in sign or not in order to reproduce the correct motion contribution.

Figure 2:
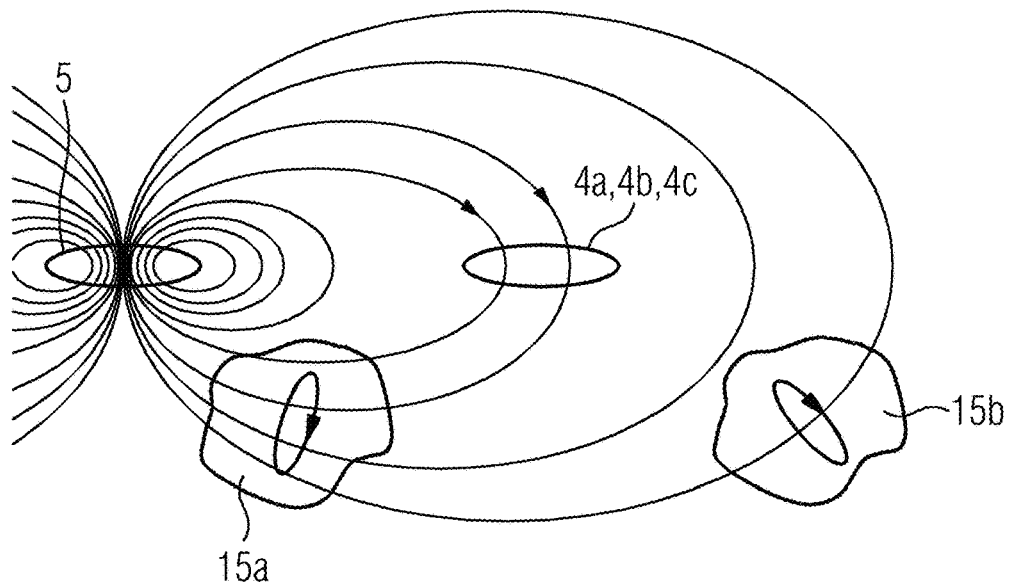
FIG. 2 depicts a schematic representation of an example of an electromagnetic field distribution.
Figure 3:
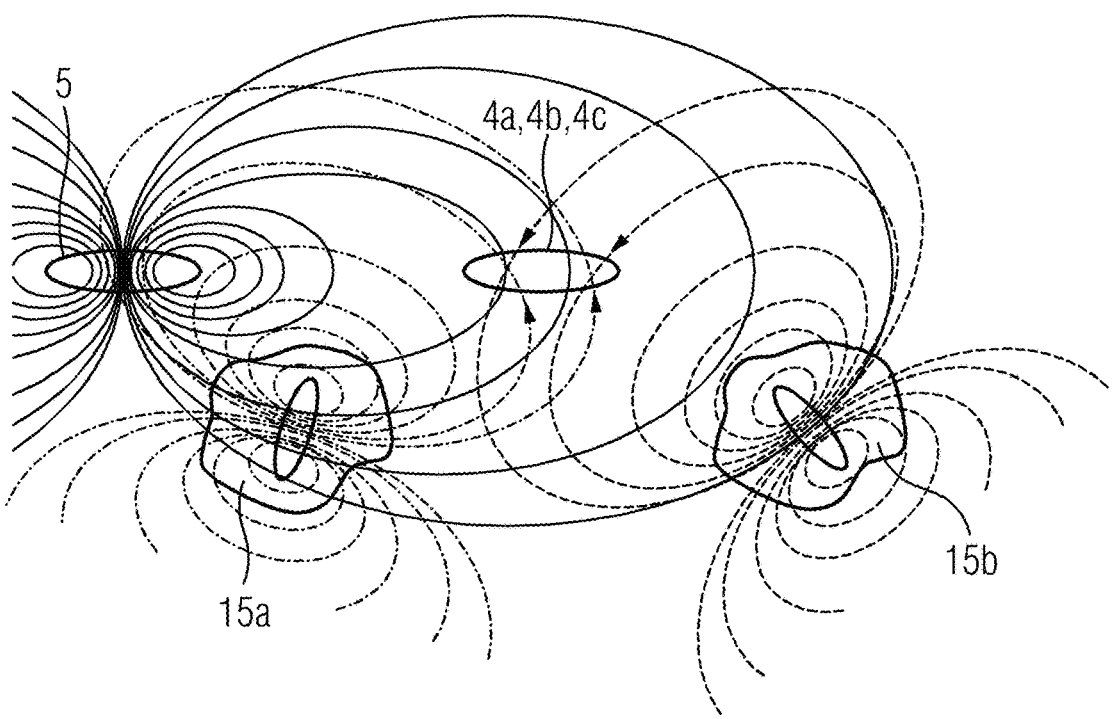
FIG. 3 depicts a further schematic representation of an example of an electromagnetic field distribution.

FIG. 2 and FIG. 3 depict schematically how receiver coils 4a, 4b, 4c may receive different signs of a signal modulation.

A primary field is generated by the reference signal generator 5, which induces Eddy currents in the conductive tissue 15a, 15b of the patient 3, which in turn generate secondary magnetic fields, as depicted schematically in FIG. 3. The individual receiver coils 4a, 4b, 4c measure the sum of the primary and the secondary fields. Depending on the location of the conductive tissues 15a, 15b and the location of the respective receiver coil 4a, 4b, 4c, the modulation of the primary field due to the secondary fields may be positive or negative. The same geometric argument applies to the more general situation of FIG. 1.

In practical applications, the distributions of the conductive tissues 15a, 15b of the patient 3 and the precise placement of the receiver coils 4a, 4b, 4c may not be known exactly. The problem may be too complex to be solved analytically. However, electromagnetic simulations may be performed by the computing unit 7 using a suitable method such as finite elements method (FEM), finite differences in the time domain (FDTD), or finite differences in the frequency domain (FDFD), using a suitable numerical model of the object, for example, the human anatomy, segmented into tissues having known values for the electrical conductivity and the electric permittivity. The model may be then not-rigidly deformed to simulate different distinct time points of a respiratory and/or cardiac cycle, and the electromagnet field may be simulated for each time point.

For each volume element, for example, pyramids in FEM or cubic voxels in FDTD or FDFD, the resulting simulated respiratory and/or cardiac motion signal may then be extracted and compared to the known ground truth, that is the known deformation of the model due to respiration and/or cardiac motion.

Figure 4:
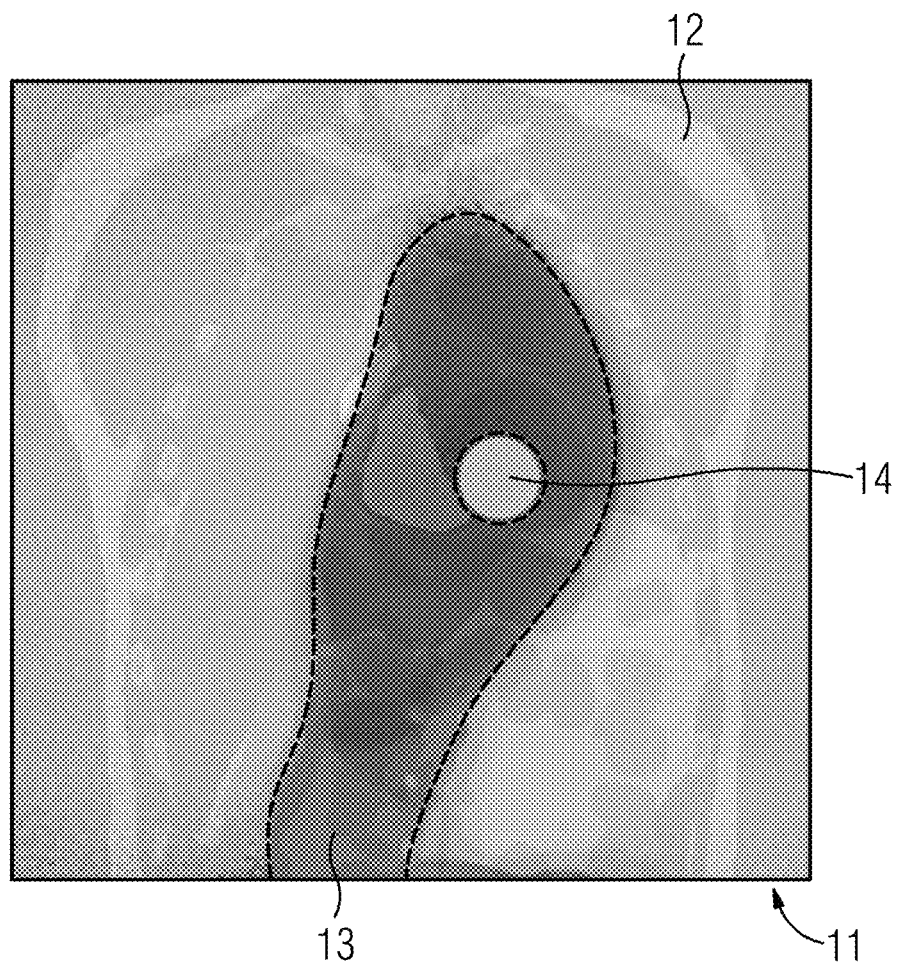
FIG. 4 depicts a schematic representation of a reference correlation map according to an exemplary implementation of a method.

By this method, a three-dimensional map of the signal sign may be constructed, as shown schematically in FIG. 4. Here, a correlation coefficient is calculated for each volume element of a plane in which the respective receiver coil 4a, 4b, 4c lies. The location of the reference signal generator 5 is represented by a circular region 14 in the resulting reference correlation map 11. A region 13 surrounding, for example, the heart of the patient 3 and extending into the abdomen shows a negative correlation, while the correlation is positive in more peripheral regions 12. The general distribution of these signs has been confirmed also in in vivo scans.

It has also been shown that, in case the receiver coils 4a, 4b, 4c are significantly larger than the reference signal generator 5, the central positive correlation is not visible.

In some implementations, a pattern as depicted schematically in FIG. 4 may be precomputed once on an object model and may be linearly scaled. The computing unit 7 may compute a correlation coefficient of the respective cardiac motion signal or respiratory motion signal of the actual measurement in response to the reference signal and compare the correlation coefficient to the reference correlation coefficients at the corresponding position of the receiver coils 4a, 4b, 4c actual to the reference map.

Alternatively, simulations as described may be precomputed for a wide array of different body shapes and sizes, and a data base or dictionary of body types with their corresponding sign distribution of the correlation coefficient may be determined. The patient 3 may then be matched at the beginning of each scan, for example, according to weight, height, sex, etc. or by actual anatomical data from pre-scans, localizers, 3D-cameras, etc. In this way, a more accurate match of the model and the actual body of the patient 3 may be achieved to obtain more reliable results.

In some embodiments, a neural network may be trained from precomputed data to generate the reference maps on a per-patient basis using localizer or pre-scan data, camera data or other patient data.

In further embodiments, a personalized digital twin model may be constructed from, for example, pre-scan, localizer or camera data and a low-resolution FEM, FDTD, or FDFD simulation may be computed directly before starting the triggered scans. The resolution may be constrained by the available computing power and the time permissible to perform these simulations.

The computing unit may then schedule or trigger data acquisition or the MR imaging depending on the, if required, corrected motion signals or reconstruct a motion compensated image depending on the motion signals.

As described, the improved concept allows to characterize the motion of an object, in particular for MRI imaging, reliably without additional information sources or without relying on empirical data. Consequently, it may be avoided that normal physiological variations or pathological changes are misinterpreted or impair the analysis. The improved concept does not rely on a priori assumptions about the signal behavior and instead aims to determine the signal sign at any arbitrary location, for example, by simulations of observable factors such as body shape and size.

It is to be understood that the elements and features recited in the appended claims may be combined in different ways to produce new claims that likewise fall within the scope of the present disclosure. Thus, whereas the dependent claims appended below depend from only a single independent or dependent claim, it is to be understood that these dependent claims may, alternatively, be made to depend in the alternative from any preceding or following claim, whether independent or dependent, and that such new combinations are to be understood as forming a part of the present specification.

While the present disclosure has been described above by reference to various embodiments, it may be understood that many changes and modifications may be made to the described embodiments. It is therefore intended that the foregoing description be regarded as illustrative rather than limiting, and that it be understood that all equivalents and/or combinations of embodiments are intended to be included in this description.

The invention claimed is:

1. A method for correcting a motion signal characterizing a motion of an object at least partially located in a target region, the method comprising:
    emitting a pilot tone signal, by a pilot tone generator of a magnetic resonance imaging system, into the target region;
    generating two or more receiver coil signals in response to the emitted pilot tone signal by two or more receiver coils located in the target region;
    determining, by a computing unit, a first motion signal characterizing a first motion of the object depending on temporal modulations of the two or more receiver coil signals;
    computing, by the computing unit, a first correlation coefficient of the first motion signal and a first receiver coil signal of the two or more receiver coil signals, wherein the first receiver coil signal is generated by a first receiver coil of the two or more receiver coils;
    determining, by the computing unit, a first reference correlation coefficient is depending on a location of the first receiver coil based on a first reference correlation map;
    comparing the first correlation coefficient to the first reference correlation coefficient; and
    correcting, by the computing unit, the first motion signal, wherein a sign of the first motion signal is inverted depending on a result of the comparing of the first correlation coefficient to the first reference correlation coefficient.

2. The method of claim 1, further comprising, for each of at least one second receiver coil of the two or more receiver coils:
    computing, by the computing unit, a respective second correlation coefficient of the first motion signal and a respective second receiver coil signal of the two or more receiver coil signals, which is generated by the respective second receiver coil; and
    determining, by the computing unit, a respective second reference correlation coefficient depending on a location of the respective second receiver coil based on the first reference correlation map,
    wherein the first motion signal is corrected by the computing unit depending on the second correlation coefficient and the second reference correlation coefficient.

3. The method of claim 2, further comprising:
    computing, by the computing unit, a weighted sum of the first correlation coefficient and the second correlation coefficient; and
    computing, by the computing unit, a weighted reference sum of the first reference correlation coefficient and the second reference correlation coefficient,
    wherein the first motion signal is corrected by the computing unit depending on the weighted sum and the weighted reference sum.

4. The method of claim 3, further comprising:
    providing a time-dependent object model of the object concerning an electrical conductivity and an electric permittivity;
    providing a model for the pilot tone generator;
    carrying out an electromagnetic simulation depending on the object model and the model for the pilot tone generator;
    determining a first simulated motion signal characterizing a first motion of the object model depending on temporal modulations of a result of the electromagnetic simulation; and
    generating the first reference correlation map depending on the first simulated motion signal.

5. The method of claim 4, further comprising:
    determining, by the computing unit, a second motion signal characterizing a second motion of the object depending on the temporal modulations of the two or more receiver coil signals;
    computing, by the computing unit, a second correlation coefficient of the second motion signal and the first receiver coil signal is computed by the computing unit;
    determining, by the computing unit, a second reference correlation coefficient depending on the location of the first receiver coil based on a predetermined second reference correlation map; and
    correcting, by the computing unit, the second motion signal depending on the second correlation coefficient and the second reference correlation coefficient.

6. The method of claim 1, further comprising:
    providing a time-dependent object model of the object concerning an electrical conductivity and an electric permittivity;
    providing a model for the pilot tone generator;

carrying out an electromagnetic simulation depending on the object model and the model for the pilot tone generator;
determining a first simulated motion signal characterizing a first motion of the object model depending on temporal modulations of a result of the electromagnetic simulation; and
generating the first reference correlation map depending on the first simulated motion signal.

7. The method of claim 1, further comprising:
determining, by the computing unit, a second motion signal characterizing a second motion of the object depending on the temporal modulations of the two or more receiver coil signals;
computing, by the computing unit, a second correlation coefficient of the second motion signal and the first receiver coil signal is computed by the computing unit;
determining, by the computing unit, a second reference correlation coefficient depending on the location of the first receiver coil based on a predetermined second reference correlation map; and
correcting, by the computing unit, the second motion signal depending on the second correlation coefficient and the second reference correlation coefficient.

8. The method of claim 1, wherein the first motion signal is determined by applying a blind source separation algorithm to the two or more receiver coil signals.

9. The method of claim 8, wherein the blind source separation algorithm comprises an independent component analysis algorithm or a dependent component analysis algorithm or a principal component analysis algorithm or a stationary subspace analysis algorithm.

10. The method of claim 1, wherein the sign of the first motion signal is inverted when the first correlation coefficient and the first reference correlation coefficient have opposite signs.

11. A method for imaging an object, the method comprising:
positioning the object at least partially in a target region;
emitting a pilot tone signal, by a pilot tone generator of a magnetic resonance imaging system, into the target region;
generating two or more receiver coil signals in response to the emitted pilot tone signal by two or more receiver coils located in the target region;
determining, by a computing unit, a first motion signal characterizing a first motion of the object depending on temporal modulations of the two or more receiver coil signals;
computing, by the computing unit, a first correlation coefficient of the first motion signal and a first receiver coil signal of the two or more receiver coil signals, wherein the first receiver coil signal is generated by a first receiver coil of the two or more receiver coils;
determining, by the computing unit, a first reference correlation coefficient is depending on a location of the first receiver coil based on a first reference correlation map; and
comparing the first correlation coefficient to the first reference correlation coefficient; and
correcting, by the computing unit, the first motion signal, wherein a sign of the first motion signal is inverted depending on a result of the comparing of the first correlation coefficient to the first reference correlation coefficient;

generating, by the computing unit, an image of the object depending on data acquired during a data acquisition period;
generating, by the computing unit, motion compensated data depending on the acquired data and on the corrected first motion signal; and
generating the image depending on the motion compensated data and/or triggering or scheduling the data acquisition period by the computing unit depending on the corrected first motion signal.

12. The method of claim 11, wherein the sign of the first motion signal is inverted when the first correlation coefficient and the first reference correlation coefficient have opposite signs.

13. A magnetic resonance imaging (MRI) system for correcting a motion signal characterizing a motion of an object, the MRI system comprising:
a pilot tone generator;
a control unit configured to control the pilot tone generator to emit a pilot tone signal into a target region, wherein the object is at least partially located in the target region;
two or more receiver coils located in the target region, wherein the two or more receiver coils are configured to generate two or more receiver coil signals in response to the emitted pilot tone signal; and
a computing unit configured to:
determine a first motion signal characterizing a first motion of the object depending on temporal modulations of the two or more receiver coil signals;
compute a first correlation coefficient of the first motion signal and a first receiver coil signal of the two or more receiver coil signals, wherein the first receiver coil signal is generated by a first receiver coil of the two or more receiver coils;
determine a first reference correlation coefficient depending on a location of the first receiver coil based on a first reference correlation map; and
compare the first correlation coefficient to the first reference correlation coefficient; and
correct the first motion signal, wherein a sign of the first motion signal is inverted depending on a result of the comparing of the first correlation coefficient to the first reference correlation coefficient.

14. The MRI system of claim 13, further comprising:
a signal source configured to emit a signal into the target region during an acquisition period; and
a sensing arrangement configured to generate acquired data in response to the signal emitted by the signal source,
wherein the computing unit is configured to:
generate an image of the object depending on the acquired data; and
generate motion compensated data depending on the acquired data and on the corrected first motion signal and to generate the image depending on the motion compensated data and/or to trigger or schedule a data acquisition period depending on the corrected first motion signal.

15. The MRI system of claim 13, wherein the sign of the first motion signal is inverted when the first correlation coefficient and the first reference correlation coefficient have opposite signs.

* * * * *